US008773790B2

(12) United States Patent  (10) Patent No.: US 8,773,790 B2
Tan et al.                  (45) Date of Patent:     Jul. 8, 2014

(54) SYSTEMS AND METHODS FOR DYNAMIC SCALING IN A READ DATA PROCESSING SYSTEM

(75) Inventors: Weijun Tan, Longmont, CO (US);
 Shaohua Yang, Santa Clara, CA (US);
 Kelly Fitzpatrick, Sudbury, MA (US);
 Zongwang Li, San Jose, CA (US); Hao Zhong, San Jose, CA (US)

(73) Assignee: LSI Corporation, San Jose, CA (US)

( * ) Notice: Subject to any disclaimer, the term of this patent is extended or adjusted under 35 U.S.C. 154(b) by 131 days.

(21) Appl. No.: 13/126,748

(22) PCT Filed: Apr. 28, 2009

(86) PCT No.: PCT/US2009/041867
 § 371 (c)(1),
 (2), (4) Date: Apr. 28, 2011

(87) PCT Pub. No.: WO2010/126482
 PCT Pub. Date: Nov. 4, 2010

(65) Prior Publication Data
 US 2012/0033320 A1  Feb. 9, 2012

(51) Int. Cl.
 *G11B 5/09* (2006.01)
 *G11B 20/10* (2006.01)
 *G11B 7/00* (2006.01)
 *G06F 7/00* (2006.01)
 *G06F 15/00* (2006.01)

(52) U.S. Cl.
 USPC ............................................ 360/39; 708/208

(58) Field of Classification Search
 None
 See application file for complete search history.

(56) References Cited

U.S. PATENT DOCUMENTS

| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |
| 5,417,500 | A | 5/1995 | Martinie |
| 5,513,192 | A | 4/1996 | Janku |
| 5,523,903 | A | 6/1996 | Hetzler |

(Continued)

FOREIGN PATENT DOCUMENTS

| EP | 1094612 | 4/2001 |
| JP | 11163742 | 6/1999 |

(Continued)

OTHER PUBLICATIONS

Blazek, Z. et al "A DSP-based Implementatin of a Turbo-Detector", Global Telecommunications Conf. IEEE vol. 5 1998.

(Continued)

*Primary Examiner* — Daniell L Negron
(74) *Attorney, Agent, or Firm* — Hamilton DeSanctis & Cha (57) ABSTRACT

Various embodiments of the present invention provide systems and methods for data processing. For example, a data processing system is disclosed that includes a decoder circuit providing a decoded output, and a dynamic scalar calculation circuit that determines a first dynamic scaling value and a second dynamic scaling value based at least in part on the decoded output. A first multiplier circuit multiplies the decoded output by the first dynamic scaling value and provides a first scaled output. A detector circuit receives the first scaled output and provides a detected output. A second multiplier circuit multiplies the detected output by the second dynamic scaling value and provides a second scaled output.

20 Claims, 7 Drawing Sheets

(56) References Cited

U.S. PATENT DOCUMENTS

| | | | |
|---|---|---|---|
| 5,550,810 | A | 8/1996 | Monogioudis et al. |
| 5,550,870 | A | 8/1996 | Blaker |
| 5,612,964 | A | 3/1997 | Haraszti |
| 5,710,784 | A | 1/1998 | Kindred |
| 5,717,706 | A | 2/1998 | Ikeda |
| 5,802,118 | A | 9/1998 | Bliss |
| 5,844,945 | A | 12/1998 | Nam |
| 5,898,710 | A | 4/1999 | Amrany |
| 5,923,713 | A | 7/1999 | Hatakeyama |
| 5,978,414 | A | 11/1999 | Nara |
| 5,983,383 | A | 11/1999 | Wolf |
| 6,005,897 | A | 12/1999 | Mccallister |
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson et al. |
| 6,970,511 | B1 | 11/2005 | Barnette |
| 6,986,093 | B2 | 1/2006 | Itakura |
| 6,986,098 | B2 | 1/2006 | Poeppelman |
| 7,047,474 | B2 | 5/2006 | Rhee |
| 7,058,873 | B2 | 6/2006 | Song et al. |
| 7,073,118 | B2 | 7/2006 | Greenberg |
| 7,093,179 | B2 | 8/2006 | Shea |
| 7,113,356 | B1 | 9/2006 | Wu |
| 7,117,427 | B2 | 10/2006 | Ophir et al. |
| 7,133,228 | B2 | 11/2006 | Fung et al. |
| 7,184,486 | B1 | 2/2007 | Wu |
| 7,191,378 | B2 | 3/2007 | Eroz |
| 7,203,887 | B2 | 4/2007 | Eroz et al. |
| 7,308,061 | B1 | 12/2007 | Huang |
| 7,310,768 | B2 | 12/2007 | Eidson et al. |
| 7,313,750 | B1 | 12/2007 | Feng |
| 7,370,258 | B2 | 5/2008 | Iancu et al. |
| 7,415,651 | B2 | 8/2008 | Argon |
| 7,502,189 | B2 | 3/2009 | Sawaguchi et al. |
| 7,523,375 | B2 | 4/2009 | Spencer |
| 7,587,657 | B2 | 9/2009 | Haratsch |
| 7,590,168 | B2 | 9/2009 | Raghavan et al. |
| 7,643,582 | B2 | 1/2010 | Chow |
| 7,643,585 | B2 | 1/2010 | Sawada |
| 7,646,829 | B2 | 1/2010 | Ashley et al. |
| 7,702,986 | B2 | 4/2010 | Bjerke et al. |
| 7,752,523 | B1 | 7/2010 | Chaichanavong et al. |
| 7,779,325 | B2 | 8/2010 | Song |
| 7,802,172 | B2 | 9/2010 | Vila Casado et al. |
| 7,958,425 | B2 | 6/2011 | Chugg et al. |
| 7,996,746 | B2 | 8/2011 | Livshitz et al. |
| 8,201,051 | B2 | 6/2012 | Tan et al. |
| 8,291,284 | B2 | 10/2012 | Savin |
| 8,422,562 | B2 * | 4/2013 | Yoshimatsu et al. ..... 375/240.25 |
| 2002/0041459 | A1 | 4/2002 | Singer |
| 2006/0123285 | A1 | 6/2006 | De Araujo et al. |
| 2007/0230407 | A1 | 10/2007 | Petrie et al. |
| 2007/0297496 | A1 | 12/2007 | Park |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |

FOREIGN PATENT DOCUMENTS

| | | |
|---|---|---|
| JP | H11-167342 | 6/1999 |
| JP | 20020309569 | 5/2004 |
| JP | 2007-142832 | 6/2007 |
| WO | WO 01-39188 | 5/2001 |
| WO | WO 2008/004215 | 1/2008 |

OTHER PUBLICATIONS

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systems—I: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Vasic, B., "High-Rate Girth-Eight Codes on Rectangular Integer Lattices", IEEE Trans. Communications, vol. 52, Aug. 2004, pp. 1248-1252.

(56) References Cited

OTHER PUBLICATIONS

Vasic, B., "High-Rate Low-Density Parity-Check Codes Based on Anti-Pasch Affine Geometries," Proc ICC 2002, pp. 1332-1336.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor,"ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

Papke, et al "Improved Decoding with the SOVA in a parallel concatenated (Turbo-Code) Scheme" Communications, 1996, ICC 96 Conf. Record vol. 1.

\* cited by examiner

SYSTEMS AND METHODS FOR DYNAMIC SCALING IN A READ DATA PROCESSING SYSTEM

CROSS REFERENCE TO RELATED APPLICATIONS

The present application claims priority to (is a US National Phase Application of) PCT Patent Application No. PCT/US2009/041867 filed Apr. 28, 2009 and entitled SYSTEMS AND METHODS FOR DYNAMIC SCALING IN A READ DATA PROCESSING SYSTEM. The entirety of the aforementioned reference is incorporated herein by reference for all purposes.

BACKGROUND OF THE INVENTION

The present inventions are related to systems and methods for detecting and/or decoding information, and more particularly to systems and methods for performing multiple data detection and decode processes.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. The effectiveness of any transfer is impacted by any data losses caused by various factors. In some cases, an encoding/decoding process is used to enhance the ability to detect a data error and to correct such data errors. As an example, a simple data detection and decode may be performed, however, such a simple process often lacks the capability to converge on a corrected data stream.

Figure 1:
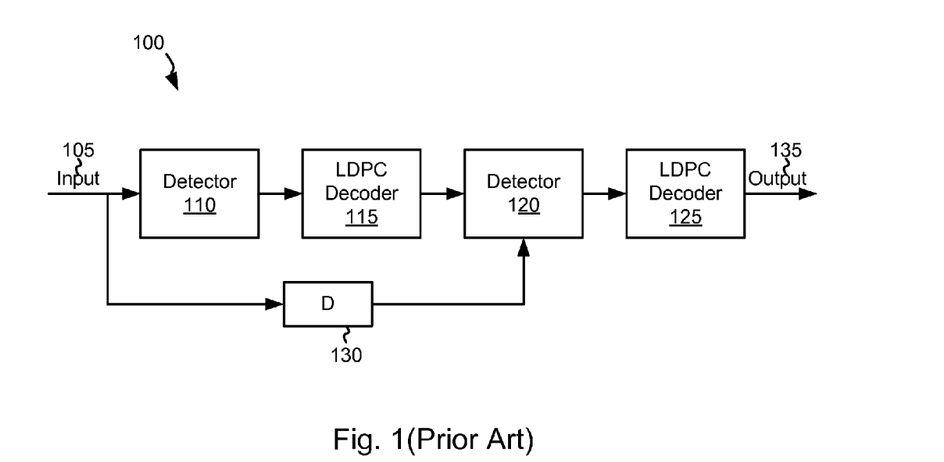
FIG. 1 depicts a prior art two stage data detection and decoding system.

To heighten the possibility of convergence, various existing processes utilize two or more detection and decode iterations. Turning to FIG. 1, an exemplary prior art two stage data detection and decode circuit 100 is depicted. Two stage data detection and decode circuit 100 receives a data input 105 that is applied to a detector 110. A hard and soft output from detector 110 is provided to an LDPC decoder 115. Input 105 is fed forward via a buffer 130 to another detector 120. Detector 120 uses a soft output of LDPC decider 115 and input 105 to perform an additional data detection process. A hard and soft output from detector 120 is provided to an LDPC decoder 125 that performs a second decoding process and provides an output 135. Where the initial detection and decode provided by detector 110 and LDPC decoder 115 does not converge, the subsequent detection and decode provided by detector 120 and LDPC decoder 125 provide an additional opportunity to converge. In these systems, various scalars are designed into the systems to massage data between various stages of the process. These scalars are either fixed at design time or are programmable static values that can be adjusted once the system is deployed in a storage medium. In some cases, however, data from one stage to another stage saturates limiting the capability of the system.

Hence, for at least the aforementioned reasons, there exists a need in the art for advanced systems and methods for data processing.

BRIEF SUMMARY OF THE INVENTION

The present inventions are related to systems and methods for detecting and/or decoding information, and more particularly to systems and methods for performing iterative data decoding and/or detection.

Various embodiments of the present invention provide data processing systems. Such data processing systems include a decoder circuit providing a decoded output, and a dynamic scalar calculation circuit that determines a first dynamic scaling value and a second dynamic scaling value based at least in part on the decoded output. A first multiplier circuit multiplies the decoded output by the first dynamic scaling value and provides a first scaled output. A detector circuit receives the first scaled output and provides a detected output. A second multiplier circuit multiplies the detected output by the second dynamic scaling value and provides a second scaled output.

In some instances of the aforementioned embodiments, the dynamic scalar calculation circuit determines a number of saturated outputs in the decoded output. In some cases, the first dynamic scaling value is set to a first default value when the number of saturated outputs exceeds a threshold value; the first dynamic scaling value is set to a minimum value when the number of saturated outputs is less than the threshold value; the second dynamic scaling value is set to a second default value when the number of saturated outputs exceeds the threshold value, and the second dynamic scaling value is set to a maximum value when the number of saturated outputs is less than the threshold value. In other cases, having a number of saturated outputs exceeding a threshold value is an out of bounds condition; an index corresponding to the number of successive out of bounds conditions is determined; wherein the first dynamic scaling value is set to a first scalar value corresponding to the index; and the second dynamic scaling value is set to a second scalar value corresponding to the index. In some such cases, the first scalar value and second scalar value are maintained in a lookup table, and the index is a pointer into the lookup table. In other cases, an index corresponding to the number of saturated outputs is determined; the first dynamic scaling value is set to a first scalar value corresponding to the index; and the second dynamic scaling value is set to a second scalar value corresponding to the index. In some such cases, the first scalar value and second scalar value are maintained in a lookup table, and the index is a pointer into the lookup table.

In other instances of the aforementioned embodiments, the dynamic scalar calculation circuit determines a number of violated checks represented in the decoded output. In some cases, the first dynamic scaling value is set to a first default value when the number of violated checks is less than a first threshold value; the first dynamic scaling value is set to a minimum value when the number of violated checks is greater than the first threshold value; the second dynamic scaling value is set to a second default value when the number of violated checks is less than a second threshold value, and the second dynamic scaling value is set to a maximum value when the number of violated checks is greater than the second threshold value. In other cases, having a number of violated checks less than a threshold value is an out of bounds condition; an index corresponding to the number of successive out of bounds conditions is determined; the first dynamic scaling value is set to a first scalar value corresponding to the index; and the second dynamic scaling value is set to a second scalar value corresponding to the index. In some such cases, the first scalar value and second scalar value are maintained in a lookup table, and the index is a pointer into the lookup table.

Other embodiments of the present invention provide methods for data processing. The methods include providing a decoder circuit that receives a first input and provides a decoded output, and a detector circuit that receives a second input and provides a detected output. The methods further include dynamically determining a first scaling value and a second scaling value based at least in part on the decoded output; multiplying the decoded output by the first scaling value to yield the second input; and multiplying the detected output by the second scaling value to yield a product output.

Yet other embodiments of the present invention provide disk drive systems. Such disk drive systems include a storage medium, and a read channel device receiving data derived from the storage medium. The read channel device includes a decoder circuit providing a decoded output, and a dynamic scalar calculation circuit that determines a first dynamic scaling value and a second dynamic scaling value based at least in part on the decoded output. A first multiplier circuit multiplies the decoded output by the first dynamic scaling value and provides a first scaled output. A detector circuit receives the first scaled output and provides a detected output. A second multiplier circuit multiplies the detected output by the second dynamic scaling value and provides a second scaled output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for detecting and/or decoding information, and more particularly to systems and methods for performing iterative data decoding and/or detection.

Various embodiments of the present invention provide compact hardware solutions for decoding suitable for read channel, wireless transmission and other applications. Such decoding/detection circuitry includes a soft decision decoder providing data to a data detector. The output from the soft decision decoder is scaled by a first scalar before being provided to the data detector, and the output of the data detector is scaled by a second scalar. The first scalar and the second scalar are dynamically calculated based upon the output of the soft decision decoder. As one advantage, such an approach may be used to reduce saturation, and thereby increasing the probability that the decoding/detection circuitry will converge on the desired result. Saturation is the number of soft decisions provided by a decoder circuit that are equal to or exceed a maximum.

Figure 2:
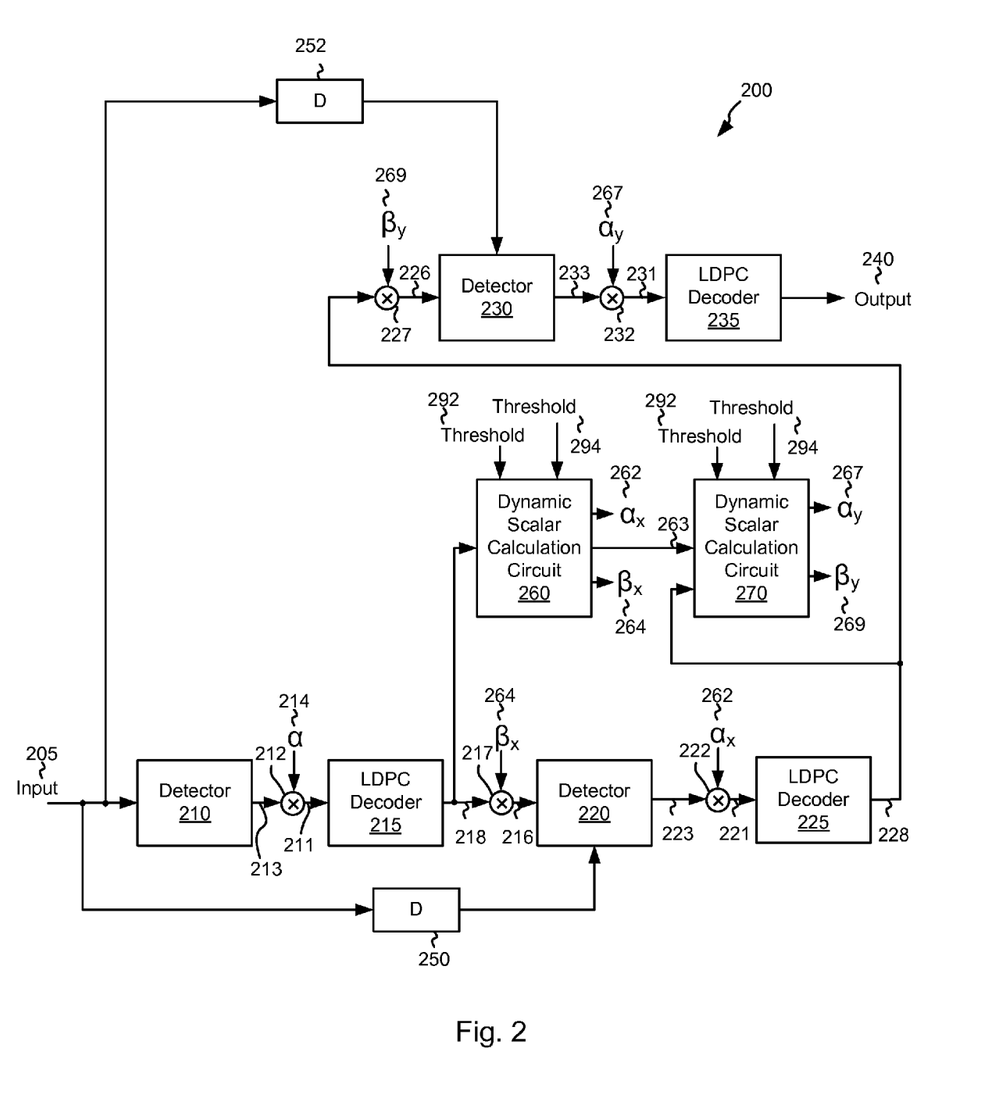
FIG. 2 depicts a data processing circuit including dynamic scalars in accordance with one or more embodiments of the present invention.

Turning to FIG. 2, a data processing circuit 200 including dynamic scalars is depicted in accordance with one or more embodiments of the present invention. Data processing circuit 200 includes a series of data detector circuits and data decoder circuits that provide for multiple pass processing of a received data input. In particular, data input 201 is received by a data detector circuit 210. Data detector circuit 210 may be any data detection circuit known in the art. For example, in one particular embodiment of the present invention, data detector circuit 210 is a maximum a posteriori (MAP) detector as are known in the art. Based upon the disclosure provided herein, one of ordinary skill in the art will recognize a variety of other types of detector circuits and/or algorithms that may be used in relation to different embodiments of the present invention. Data detector circuit 210 performs a data detection process on data input 205 and provides a detected output 213.

Detected output 213 is multiplied by a scaling factor 214 ($\alpha$) using a multiplier circuit 212. A product output 211 from multiplier circuit 212 is provided to a decoder circuit 215. Decoder circuit 215 may be any circuit capable of applying a decoding algorithm to a received input. In some particular embodiments of the present invention, decoder circuit 215 is a low density parity check (LDPC) decoder circuit as are known in the art. Based upon the disclosure provided herein, one of ordinary skill in the art will recognize a variety of decoder circuits that may be used in relation to different embodiments of the present invention. Scaling factor 214 is a static value selected either at design time or programmable at the time that data processing circuit 200 is deployed. Scaling factor 214 is designed to scale detected output 214 to maintain the operation of decoder circuit 215 in an unsaturated region.

Decoder circuit 215 provides a decoded output 218. Decoded output 218 is multiplied by a dynamic scaling factor 264 ($\beta_x$) using a multiplier circuit 217. A product output 216 from multiplier circuit 217 is provided to a data detector circuit 220 that uses the original input 205 delayed through a delay circuit 250 to align it in time with product output 216. Data detector circuit 220 may be any data detection circuit known in the art. For example, in one particular embodiment of the present invention, data detector circuit 220 is a maximum a posteriori (MAP) detector as are known in the art. Based upon the disclosure provided herein, one of ordinary skill in the art will recognize a variety of other types of detector circuits and/or algorithms that may be used in relation to different embodiments of the present invention. Data detector circuit 220 performs a data detection process on product output 216 and provides a detected output 223.

Detected output 223 is multiplied by a scaling factor 262 ($\alpha_x$) using a multiplier circuit 222. A product output 221 from multiplier circuit 222 is provided to a decoder circuit 225. A dynamic scalar computation circuit 260 calculates scaling factor 264 and scaling factor 262 using decoded output 218. In particular, dynamic scalar computation circuit 260 receives an indication of the number of parity checks for the codeword currently processed by decoder circuit 215 that remain violated. This number is referred to herein as the violation count. Further, dynamic scalar computation circuit 260 counts the number of bit periods in decoded output that are saturated (i.e., have a value equal to the maximum achievable value). This value is referred to as the saturation count. Dynamic scalar computation circuit 260 compares the violation count with a threshold value 292 and compares the saturation count with another threshold value 294. In some embodiments, both threshold value 292 and threshold value 294 are programmable. The values of scaling factor 262 and scaling factor 264 are updated if either the violation count is less than threshold value 292 or if the saturation count is greater than threshold 294. The following pseudocode describes the update condition:

```
If (violation count < threshold 292 || saturation count > threshold 294) {
    Update Scaling Factors
}
Else {
    Maintain Scaling Factors
}
```

In an exemplary case, dynamic modification of scaling factor 262 and scaling factor 264 is only done whenever there is a significant number of saturated soft decisions.

Whenever an update is called for, updating scaling factor 262 and scaling factor 264 may be done in one a variety of ways depending upon the particular implementation. Initially, scaling factor 262 and scaling factor 264 are set equal to default values. The following pseudocode describes the initial condition:

$$\text{Scaling Factor 264} = \beta_{default}; \text{ and}$$
$$\text{Scaling Factor 262} = \alpha_{default}.$$

The default values, $\beta_{default}$ and $\alpha_{default}$ may be hard coded at design time, or may be programmable allowing for update depending upon a particular deployment of data processing circuit 200. The default values, $\beta_{default}$ and $\alpha_{default}$ may be selected to provide good performance with only minimal saturation. In one embodiment, upon a decision to update the value of scaling factor 262 and scaling factor 264, scaling factor 262 and scaling factor 264 are modified to be minimum value scaling factors in accordance with the following pseudocode:

```
If (violation count < threshold 292 || saturation count > threshold 294) {
    Scaling Factor 264 = β_minimum; and
    Scaling Factor 262 = α_minimum
}
Else {
    Scaling Factor 264 = β_default; and
    Scaling Factor 262 = α_default
}
```

The values of $\beta_{minimum}$ and $\alpha_{minimum}$ are may be hard coded at design time, or may be programmable allowing for update depending upon a particular deployment of data processing circuit 200. The default values, $\beta_{minimum}$ and $\alpha_{minimum}$ may be selected to provide good performance but with values set to avoid some saturation allowed by the default scaling factors. Other examples of dynamic modification of scaling factor 262 and scaling factor 264 are discussed below in relation to dynamic scalar computation circuit 260.

Decoder circuit 225 may be any circuit capable of applying a decoding algorithm to a received input. In some particular embodiments of the present invention, decoder circuit 225 is a low density parity check (LDPC) decoder circuit as are known in the art. Based upon the disclosure provided herein, one of ordinary skill in the art will recognize a variety of decoder circuits that may be used in relation to different embodiments of the present invention. Decoder circuit 225 provides a decoded output 228. Decoded output 228 is multiplied by a dynamic scaling factor 269 ($\beta_y$) using a multiplier circuit 227. A product output 226 from multiplier circuit 227 is provided to a data detector circuit 230 that uses the original input 205 delayed through a delay circuit 252 to align it in time with product output 226. Data detector circuit 230 may be any data detection circuit known in the art. For example, in one particular embodiment of the present invention, data detector circuit 230 is a maximum a posteriori (MAP) detector as are known in the art. Based upon the disclosure provided herein, one of ordinary skill in the art will recognize a variety of other types of detector circuits and/or algorithms that may be used in relation to different embodiments of the present invention. Data detector circuit 230 performs a data detection process using product output 226 and provides a detected output 233. Detected output 233 is multiplied by a scaling factor 267 ($\alpha_y$) using a multiplier circuit 232. A product output 231 from multiplier circuit 232 is provided to a decoder circuit 235. Decoder circuit 235 may be any circuit capable of applying a decoding algorithm to a received input. In some particular embodiments of the present invention, decoder circuit 235 is a low density parity check (LDPC) decoder circuit as are known in the art. Based upon the disclosure provided herein, one of ordinary skill in the art will recognize a variety of decoder circuits that may be used in relation to different embodiments of the present invention. Product output 231 is decoded using LDPC decoder 235 to provide a final output 240.

A dynamic scalar computation circuit 270 calculates scaling factor 269 and scaling factor 267 using decoded output 228. Dynamic scalar computation circuit 270 operates similar to dynamic scalar computation circuit 260, except that it receives a feed forward signal 263 from dynamic scalar calculation circuit 260 allowing for various incremental operational modes. In particular, dynamic scalar calculation circuit 270 receives decoded output 228 and based thereon determines whether an update of scaling factor 267 and scaling factor 269 is to occur. Similar to dynamic scalar calculation circuit 260, a update is done if either the violation count (derived from decoded output 228) is less than threshold 292 or the saturation count (derived from decoded output 228) is greater than threshold 294. The following pseudocode describes the update condition:

```
If (violation count < threshold 292 || saturation count > threshold 294) {
    Update Scaling Factors
}
Else {
    Maintain Scaling Factors
}
```

In an exemplary case, dynamic modification of scaling factor 267 and scaling factor 269 is only done whenever there is a significant number of saturated soft decisions.

Where an update is to be done, it may be done using the approach described above in relation to dynamic scalar calculation circuit 260. Initially, scaling factor 267 and scaling factor 269 are set equal to default values. The following pseudocode describes the initial condition:

---
Scaling Factor 269 = $\beta_{default}$; and
Scaling Factor 267 = $\alpha_{default}$.

---

Again, the default values, $\beta_{default}$ and $\alpha_{default}$ may be hard coded at design time, or may be programmable allowing for update depending upon a particular deployment of data processing circuit 200. The default values, $\beta_{default}$ and $\alpha_{default}$ may be selected to provide good performance with only minimal saturation. In one embodiment, upon a decision to update the value of scaling factor 267 and scaling factor 269, scaling factor 267 and scaling factor 269 are modified to be minimum value scaling factors in accordance with the following pseudocode:

---
```
If (violation count < threshold 292 || saturation count > threshold 294) {
    Scaling Factor 269 = β_maximum; and
    Scaling Factor 267 = α_minimum
}
Else {
    Scaling Factor 269 = β_default; and
    Scaling Factor 267 = α_default
}
```
---

Again, the values of $\beta_{maximum}$ and $\alpha_{minimum}$ are may be hard coded at design time, or may be programmable allowing for update depending upon a particular deployment of data processing circuit 200. The default values, $\beta_{maximum}$ and $\alpha_{minimum}$ may be selected to provide good performance but with values set to avoid some saturation allowed by the default scaling factors.

Other examples of dynamic modification of scaling factor 267 and scaling factor 269 involving feed forward signal 263 may also be used. Such approaches allow for modification of scaling factor 267 and scaling factor 269 based upon the results of dynamic scalar factor circuit 260. For example, the values of scaling factor 262 and scaling factor 264, and scaling factor 267 and scaling factor 269 are incrementally modified each successive time a need to update is indicated. Thus, for example, where an update is indicated, dynamic scalar computation circuit 260 selects a value for scaling factor 262 and scaling factor 264 based on an incremental value i=1, and a feed forward signal 263 is asserted to dynamic scalar computation circuit 270. Where an update condition remains based upon decoded output 228, the incremental value i=2 is selected for the next iteration of scaling factor 267 and scaling factor 269. In doing this, a lookup table may be used that includes successive values for scaling factor 262 and scaling factor 264, indexed by i; and scaling factor 267 and scaling factor 269, also indexed by i. The lookup table values may be defined at design time or may be programmable. The following pseudocode describes incremental modification of scaling factor 262 and scaling factor 264, and scaling factor 267 and scaling factor 269:

---
```
/*at a first instant in time where decoded output 218 is available for a given codeword*/
    If (violation count < threshold 292 || saturation count > threshold 294) {
        i=1;
        Scaling Factor 264 = β(i);
        Scaling Factor 262 = α(i); and
        Feed Forward Signal 263 = asserted
    }
    Else {
        i=0
        Scaling Factor 264 = β_default;
        Scaling Factor 262 = α_default; and
        Feed Forward Signal 263 = de-asserted
    }
/*at a second instant in time where decoded output 228 is available for the given codeword*/
    If (violation count < threshold 292 || saturation count > threshold 294) {
        If (Feed Forward Signal 263 == asserted){
            i=2;
            Scaling Factor 269 = β(i); and
            Scaling Factor 267 = α(i);
        }
        Else{
            i=1;
            Scaling Factor 269 = β(i); and
            Scaling Factor 267 = α(i);
        }
    Else {
        i=0
        Scaling Factor 269 = β_default; and
        Scaling Factor 267 = α_default
    }
```
---

In this case, $\beta(i+1)$ is greater than $\beta(i)$ and $\alpha(i+1)$ is less than $\alpha(i)$. In this way, the value of scaling factor 262 and scaling factor 264, and scaling factor 267 and scaling factor 269 can be modified incrementally based upon a prior result.

In yet another embodiment, the values of scaling factor 262 and scaling factor 264, and scaling factor 267 and scaling factor 269 are incrementally modified each successive time a need to update is indicated, with the magnitude of the increment being controlled not by a predefined increase in the incremental value (e.g., increasing I from one to two), but by an incremental increase corresponding to the value of the saturation count for the particular stage. To do this, lookup table may be used that includes successive values for scaling factor 262 and scaling factor 264 indexed by I; and scaling facto 267 and scaling factor 269 also indexed by i. The lookup table values may be defined at design time or may be programmable. The following pseudocode describes incremental modification of scaling factor 262 and scaling factor 264, and scaling factor 267 and scaling factor 269:

---
```
/*at a first instant in time where decoded output 218 is available for a given codeword*/
    If (violation count < threshold 292 || saturation count > threshold 294) {
        i = i+saturation count corresponding to decoded output 218;
        Scaling Factor 264 = β(i);
        Scaling Factor 262 = α(i); and
        Feed Forward Signal 263 = asserted
    }
    Else {
        i=0
        Scaling Factor 264 = β_default; and
        Scaling Factor 262 = α_default;
        Feed Forward Signal 263 = de-asserted
    }
/*at a second instant in time where decoded output 228 is available for the given codeword*/
    If (violation count < threshold 292 || saturation count > threshold 294) {
        If (Feed Forward Signal 263 == asserted){
            i= i+saturation count corresponding to decoded output 228;
            Scaling Factor 269 = β(i); and
            Scaling Factor 267 = α(i);
        }
```

```
    Else{
        i= saturation count corresponding to decoded output
        228;
        Scaling Factor 269 = β(i); and
        Scaling Factor 267 = α(i);
    }
Else {
    i=0
    Scaling Factor 269 = β_default; and
    Scaling Factor 267 = α_default
}
```

Again, $\beta(i+1)$ is greater than $\beta(i)$ and $\alpha(i+1)$ is less than $\alpha(i)$. In this way, the value of scaling factor 262 and scaling factor 264 can be modified incrementally based upon a prior result and based upon a magnitude of the detected saturation numbers.

Figure 3A:
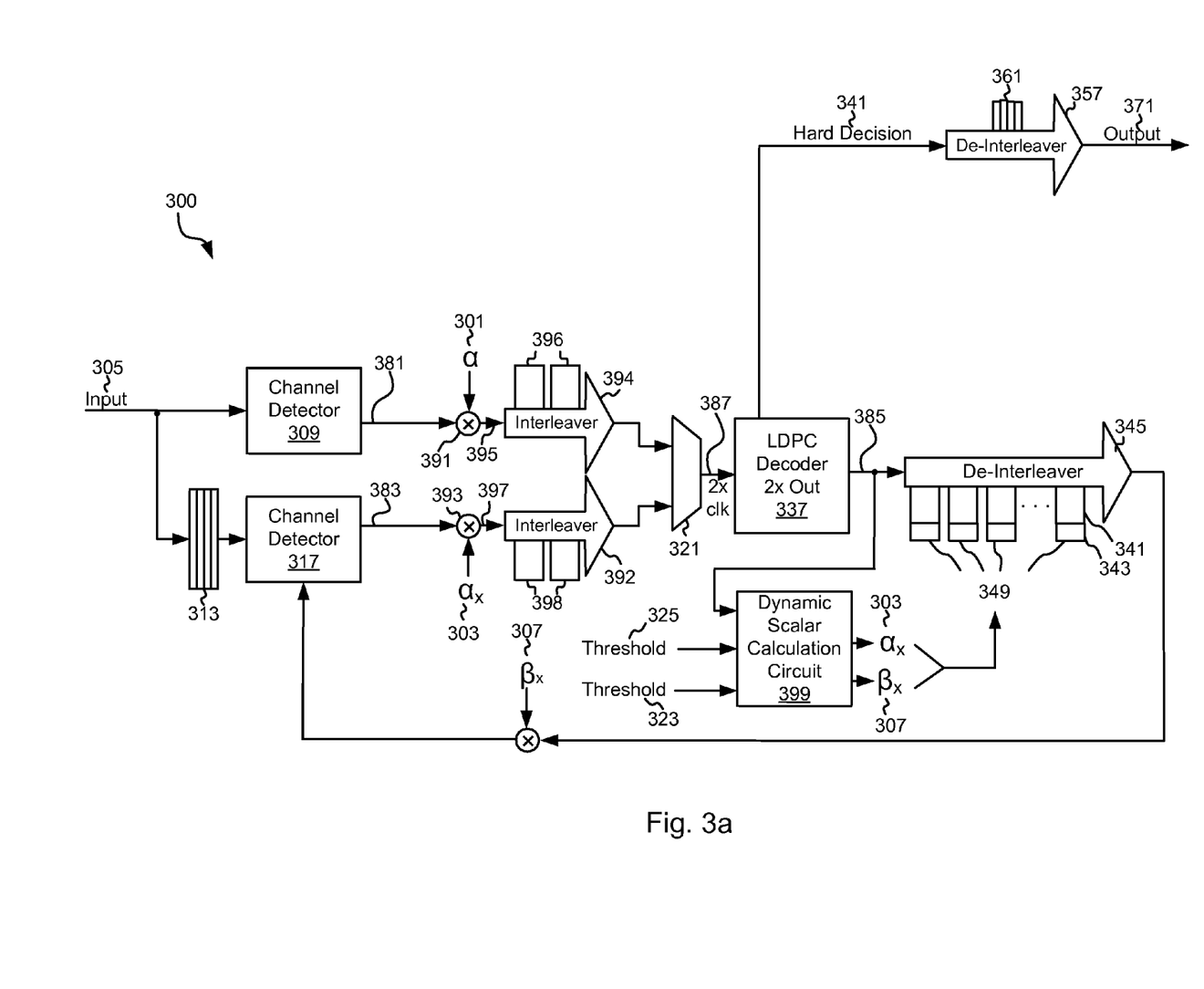
FIG. 3a shows a queuing detection and decoding circuit including dynamic scalars in accordance with various embodiments of the present invention.

Turning to FIG. 3a, a queuing detection and decoding circuit 300 including dynamic scalars is shown in accordance with various embodiments of the present invention. Queuing detection and decoding circuit 300 includes a data input 305 that is fed to a channel detector 309. In some embodiments, data input 305 may be derived from a storage medium. In particular cases, data input 305 is provided as groups of data or data sets that are sometimes referred to as codewords. In the case of a hard disk drive, the received data sets may be sectors of data from the storage medium of the hard disk drive. Based upon the disclosure provided herein, one of ordinary skill in the art will recognize other sources for data input, and other data sets that may be processed in accordance with different embodiments of the present invention.

Channel detector 309 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 305 is provided to a memory buffer 313 that is designed to hold a number of data sets received from data input 305. The size of memory buffer 313 may be selected to provide sufficient buffering such that a data set provided via data input 305 remains available at least until a first iteration processing of that same data set is complete and the processed data is available in a queue buffer 349 as more fully described below. Memory buffer 313 provides the data sets to a channel detector 317. Similar to channel detector 309, channel detector 317 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

An output 381 of channel detector 309 is multiplied by a scaling factor 301 ($\alpha$) using a multiplier circuit 391. A product output 395 from multiplier circuit 391 is provided to an interleaver circuit 394. An output 383 of channel detector 317 is multiplied by a dynamic scaling factor 303 ($\alpha_x$) using a multiplier circuit 393. A product output 397 from multiplier circuit 393 is provided to another interleaver circuit 392. Interleaver circuit 394 interleaves the output of channel detector 309 using a ping pong buffer 396, and interleaver circuit 392 interleaves the output of channel detector 317 using a ping pong buffer 398. One of the buffers in ping pong buffer 396 holds the result of a prior interleaving process of the output from channel detector 309 and is unloaded to an LDPC decoder 337 via a multiplexer 321, while the other buffer of ping pong buffer 396 holds a data set from channel detector 309 that is currently being interleaved. Similarly, one of the buffers in ping pong buffer 398 holds the result of a prior interleaving process of the output from channel detector 317 and is unloaded to LDPC decoder 337 via a multiplexer 321, while the other buffer of ping pong buffer 398 holds a data set from channel detector 317 that is currently being interleaved. It should be noted that other soft decision data decoders may be used in place of LDPC decoder 337 in different embodiments of the present invention.

LDPC decoder 337 is capable of decoding one or more data sets simultaneously. As an example, LDPC decoder 337 may be designed to decode an interleaved data set from ping pong buffer 396, to decode an interleaved data set from ping pong buffer 398, or to decode interleaved data sets from ping pong buffer 396 and ping pong buffer 398 simultaneously. The decoded data is either provided as a hard decision output 341 or to a de-interleaver circuit 345 that uses queue buffer 349 to de-interleave the decoded data and to store the de-interleaved data until channel detector 317 is available for further processing.

One of the buffers in queue buffer 349 holds the result of a prior de-interleaving process and is unloaded to channel detector 317, while another buffer of queue buffer 349 holds a decoded data set currently being de-interleaved, and one or more other buffers in queue buffer 349 maintain other non-converged data waiting for processing by channel detector 317. Non-converged data from queue buffer 349 is de-interleaved by de-interleaver 345 and passed to channel detector 317 that has access to the corresponding data set in memory buffer 313. In particular, the de-interleaved data from de-interleaver 345 is multiplied by a dynamic scaling factor 307 ($\beta_x$) using a multiplier circuit 327, and a product output of multiplier 329 is provided to channel detector 317. The data detection performed by channel detector 317 is similar to that performed by channel detector 309. Alternatively, where a data set converges in LDPC decoder 337, it is provide as hard decision output 341 to a de-interleaver circuit 357 that de-interleaves the received hard decision output 341 and stores the de-interleaved result in one of a number of memory buffers 361. Ultimately, de-interleaver circuit 357 provides the de-interleaved data stored in memory buffers 361 as an output 371.

Dynamic scaling factor 303 and dynamic scaling factor 307 are calculated for each codeword based upon a decoded output 385 corresponding to the respective codeword. Each buffer in queue buffer 349 includes an area 341 for storing decoded output 385 for a respective codeword, and another area 343 for storing dynamic scaling factor 303 and dynamic scaling factor 307 corresponding to the respective codeword. When the decoded output is pulled from a respective queue buffer for de-interleaving and processing by channel detector 317, the values for scaling factor 303 and scaling factor 307 are pulled from area 341 of the corresponding queue buffer and used for multiplication by multiplier 391 and multiplier 393.

A dynamic scalar calculation circuit 399 calculates the value for scaling factor 303 and scaling factor 307 for each respective codeword based upon decoded output 385 corresponding to the respective codeword. The calculated scaling factors are stored to the buffer in queue buffer 349 that the corresponding to decoded output 385 from which the scaling factors were calculated.

Using decoded output 385, dynamic scalar calculation circuit 399 first determines whether the values for scaling factor 303 and scaling factor 307 are to be updated. In particular, dynamic scalar computation circuit 399 receives an indication of the number of parity checks for the data set currently processed by LDPC decoder circuit 337 that remain violated. This number is referred to herein as the violation count. Further, dynamic scalar computation circuit 399 counts the number of bit periods in decoded output 385 that are saturated (i.e., have a value equal to the maximum achievable value). This value is referred to as the saturation count. Dynamic scalar computation circuit 399 compares the violation count with a threshold value 323 and compares the saturation count with another threshold value 325. In some embodiments, both threshold value 323 and threshold value 325 are programmable. The values of scaling factor 303 and scaling factor 307 are updated if either the violation count is less than threshold value 323 or if the saturation count is greater than threshold 325. The following pseudocode describes the update condition:

```
If (violation count < threshold 323 || saturation count > threshold 325) {
    Update Scaling Factors
}
Else {
    Maintain Scaling Factors
}
```

In an exemplary case, dynamic modification of scaling factor 303 and scaling factor 307 is only done whenever there is a significant number of saturated soft decisions.

Whenever an update is called for, updating scaling factor 303 and scaling factor 307 may be done in one a variety of ways depending upon the particular implementation. Initially, scaling factor 303 and scaling factor 307 are set equal to default values. The following pseudocode describes the initial condition:

```
Scaling Factor 307 = β_default; and
Scaling Factor 303 = α_default.
```

The default values, $\beta_{default}$ and $\alpha_{default}$ may be hard coded at design time, or may be programmable allowing for update depending upon a particular deployment of queuing detection and decoding circuit 300. The default values, $\beta_{default}$ and $\alpha_{default}$ may be selected to provide good performance with only minimal saturation. In one embodiment, upon a decision to update the value of scaling factor 303 and scaling factor 307, scaling factor 303 and scaling factor 307 are modified to be minimum value scaling factors in accordance with the following pseudocode:

```
If (violation count < threshold 323 || saturation count > threshold 325) {
    Scaling Factor 307 = β_maximum; and
    Scaling Factor 303 = α_minimum
}
Else {
    Scaling Factor 307 = β_default; and
    Scaling Factor 303 = α_default
}
```

The values of $\beta_{maximum}$ and $\alpha_{minimum}$ are may be hard coded at design time, or may be programmable allowing for update depending upon a particular deployment of data processing circuit 200. The default values, $\beta_{maximum}$ and $\alpha_{minimum}$ may be selected to provide good performance but with values set to avoid some saturation allowed by the default scaling factors.

In another embodiment, the values of scaling factor 303 and scaling factor 307 are incrementally modified each successive time a need to update is indicated. In doing this, a lookup table may be used that includes successive values for scaling factor 303 and scaling factor 307 indexed by i. The lookup table values may be defined at design time or may be programmable. The following pseudocode describes incremental modification of scaling factor 303 and scaling factor 307:

```
If (violation count < threshold 323 || saturation count > threshold 325) {
    Scaling Factor 307 = β(i+1);
    Scaling Factor 303 = α(i+1); and
    i++
}
Else {
    Scaling Factor 307 = β_default; and
    Scaling Factor 303 = α_default
    i=0
}
```

In this case, $\beta(i+1)$ is greater than $\beta(i)$ and $\alpha(i+1)$ is less than $\alpha(i)$. In this way, the value of scaling factor 303 and scaling factor 307 can be modified incrementally until a working limit is achieved.

In yet another embodiment, the values of scaling factor 303 and scaling factor 307 are incrementally modified each successive time a need to update is indicated, with the magnitude of the increment being controlled not by a counter, but by the value of the saturation count. To do this, lookup table may be used that includes successive values for scaling factor 303 and scaling factor 307 indexed by i. The lookup table values may be defined at design time or may be programmable. The following pseudocode describes incremental modification of scaling factor 303 and scaling factor 307:

```
If (violation count < threshold 323 || saturation count > threshold 325) {
    Scaling Factor 307 = β(i+saturation count);
    Scaling Factor 303 = α(i+saturation count); and
    i = i+saturation count
}
Else {
    Scaling Factor 307 = β_default; and
    Scaling Factor 303 = α_default
    i=0
}
```

Again, $\beta(i+1)$ is greater than $\beta(i)$ and $\alpha(i+1)$ is less than $\alpha(i)$. In this way, the value of scaling factor 303 and scaling factor 307 an be modified incrementally with an increment corresponding to the number of saturated outputs being reported by decoded output 385.

Queuing detection/decoding circuit 300 allows for performance of a variable number of detection and decoding iterations depending upon the introduced data. Further, in some cases, considerable power savings may be achieved through use of queuing detection/decoding circuit 300. Yet further, in some cases, a faster LDPC decoder may be implemented allowing for an increased throughput where substantial first iteration data convergence exists as multiple iterations are not necessarily required. Yet further, by allowing results of LDPC decoder 337 to be reported out of order, upstream processing does not have to wait for the completion of downstream processing. Re-ordering of the out of order results may be done by queuing detection/decoding circuit 300 or by a downstream recipient of output 371. In addition, scaling factor 303 and scaling factor 307 can be dynamically updated to enhance the performance of the decoding and detection processes being performed and thereby provide an ability for early convergence. Based upon the disclosure provided herein, one of ordinary skill in the art will recognize a variety of other advantages that may be achieved through implementation of one or more embodiments of the present invention.

Figure 3B:
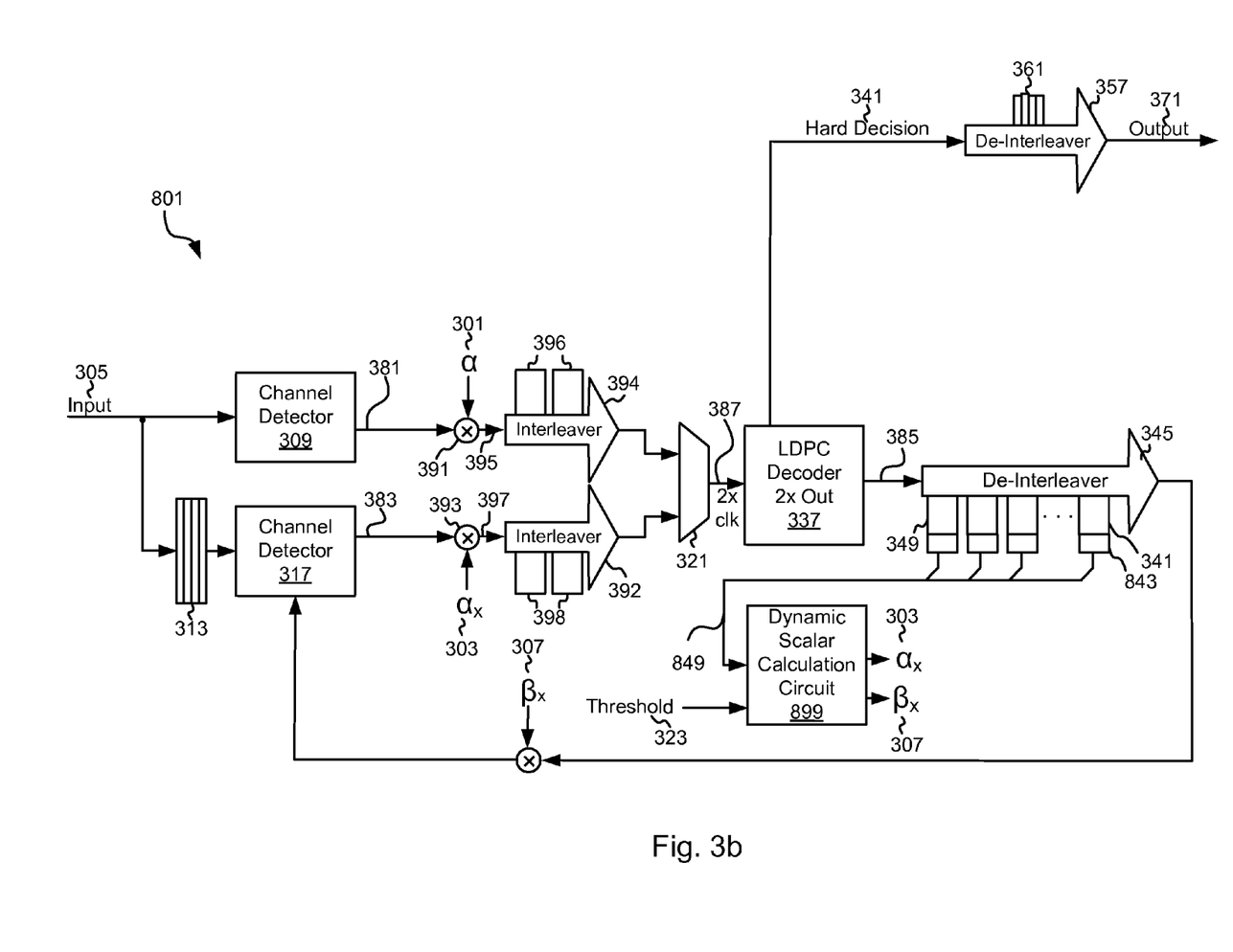
FIG. 3b shows another queuing detection and decoding circuit including dynamic scalars in accordance with various embodiments of the present invention.

Turning to FIG. 3b, another queuing detection and decoding circuit 801 including dynamic scalars is shown in accordance with other embodiments of the present invention. Queuing detection and decoding circuit 801 is substantially the same as queuing detection and decoding circuit 300. The difference is that each buffer in queue buffer 349 includes area 341 for storing decoded output 385 for a respective codeword, and another area 843 for storing a violation count from decoded output 385. This violation count may be used when the particular queue buffer 349 is selected for additional processing. The respective violation count 849 from area 843 is provided to a dynamic scalar calculation circuit 899. Dynamic scalar calculation circuit 899 receives the output of de-interleaver 345 in comparison with queuing detection and decoding circuit 300 where dynamic scalar calculation circuit 399 that receives the output prior to de-interleaver 345. Prior to applying scaling factor 303 and scaling factor 307 to the data from the selected buffer in queue buffer 349, dynamic scalar calculation circuit 899 calculates the value of scaling factor 303 and scaling factor 307. In some cases, only a violation count is used to determined whether to dynamically modify scaling factor 303 and scaling factor 307. In such a case, the following pseudocode describes the update condition:

```
If (violation count < threshold 323) {
    Update Scaling Factors
}
Else {
    Maintain Scaling Factors
}
```

Updating the scaling factors may be done using any of the approaches discussed herein.

Figure 4:
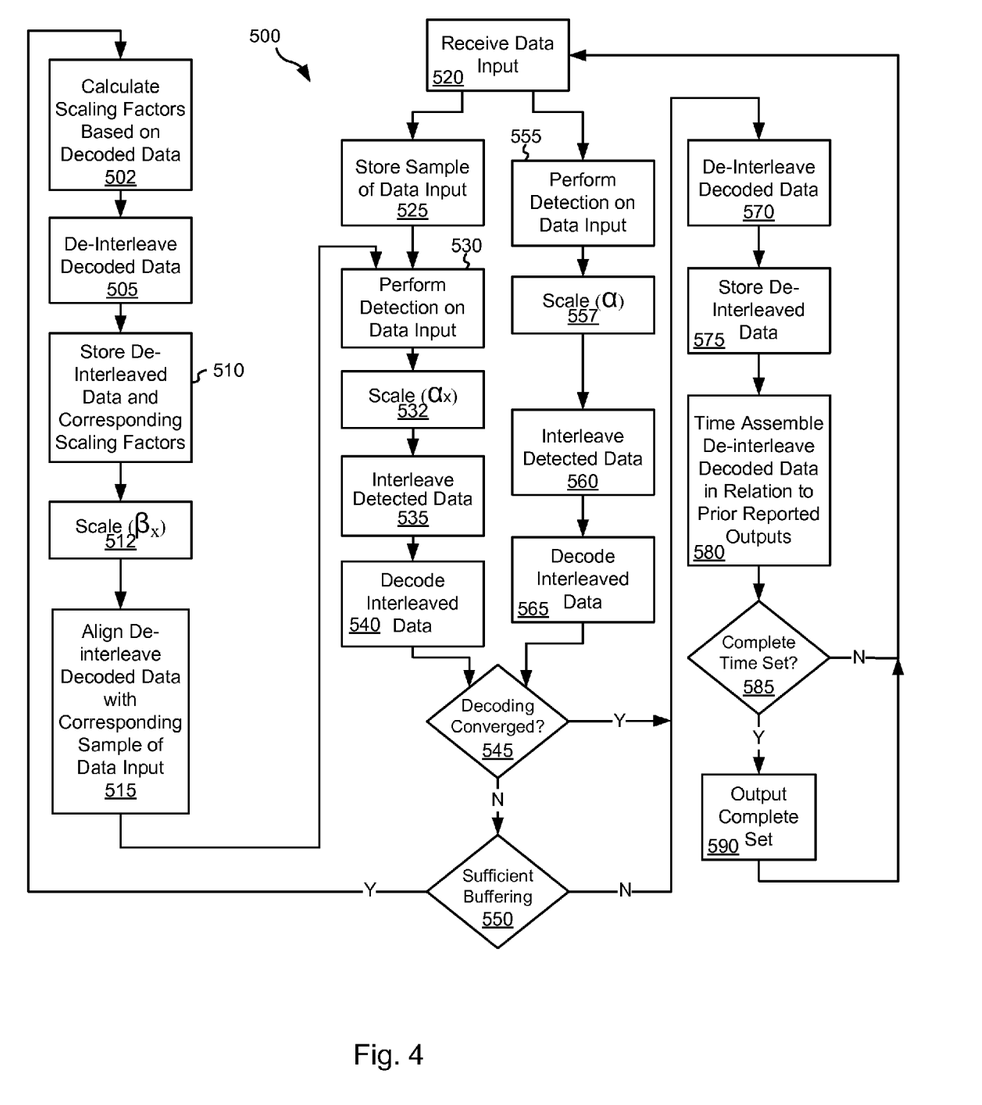
FIG. 4 is a flow diagram showing a method in accordance with some embodiments of the present invention for data processing using dynamic scaling.

Turning to FIG. 4, a flow diagram 400 shows a method in accordance with some embodiments of the present invention for data processing using dynamic scaling factors. Following flow diagram 400, a data input is received (block 520). This data input may be, but is not limited to, a series of data bits received from a magnetic recording medium or a series of bits received from a transmission channel. Based on the disclosure provided herein, one of ordinary skill in the art will recognize a variety of sources and formats for the received data input. A sample of the received data is stored in a buffer and retained for later processing (block 525). Data detection processes are performed on the received data (block 555). The resulting detected data is multiplied by a scaling factor ($\alpha$) (block 557), and the product of the multiplication is interleaved (block 560), and the interleaved data is decoded (block 565). It is then determined whether the decoding process converged (block 545), and whether there is sufficient buffering available to reprocess the data (block 550).

Where either the decoding process converged (block 545) or there is insufficient buffering available (block 550), the decoded data is de-interleaved (block 570) and stored in a buffer (block 575). The buffer includes various results that may have become available out of order, and as such the various results are reordered in the buffer to represent the order in which the corresponding data input was originally received (block 580). It is then determined if a complete time set is available in the buffer (block 585). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 585) or where the results are to be reported as they are received without regard to order, the result(s) are output to a recipient (block 590).

Alternatively, where the decoding process failed to converge (block 545) and there is sufficient buffering available (block 550), the process of detection and decoding is repeated. In particular, scaling factors ($\beta_x$ and $\alpha_x$) are calculated based upon the decoded data (block 502). The scaling factors may be calculated using one of the approaches described below in relation to FIGS. 5a-5c. The decoded data is also de-interleaved (block 505) and the resulting de-interleaved data is stored to a buffer along with the corresponding scaling factors that were recently calculated (block 510). The data is accessed from the buffer and multiplied by the scaling factor ($\beta_x$)(block 512). The de-interleaved data multiplied by the scaling factor is aligned with the corresponding sample of the data input (block 515) once the data detector is available. The de-interleaved data and the corresponding sample data input is provided to the data detector where a subsequent data detection is performed (block 530) on the originally stored sample of data input (block 525) using the soft input developed in the earlier processing of the same data input (blocks 555, 560, 565, 545, 550, 505, 510, 515). The result of the data detection process is interleaved (block 535) and the interleaved data is decoded (block 540). At this point, it is determined whether the data detection and decoding process failed to converge (block 545) and is to be repeated, or whether the result converged (block 545) and is to be reported.

Figure 5A:
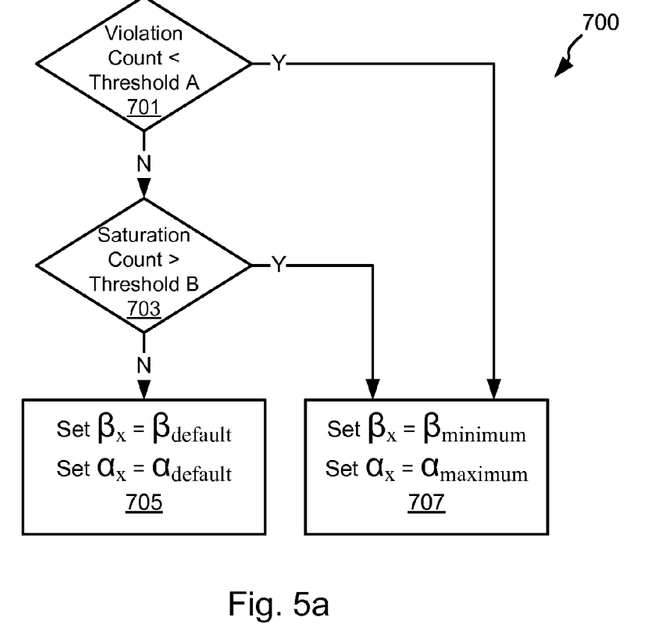
FIGS. 5a-5d are four flow diagrams showing different approaches for dynamically calculating scaling factors in accordance with different embodiments of the present invention.
Figure 5B:
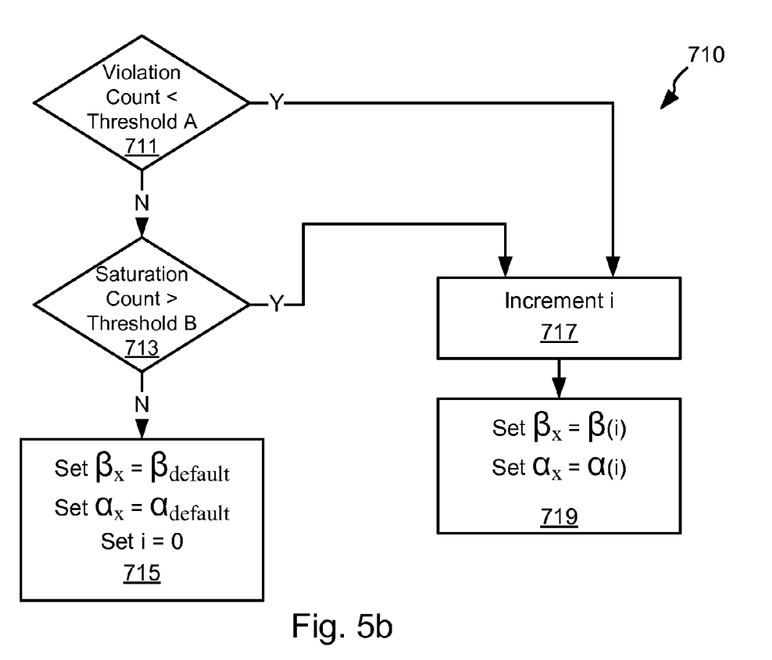
Figure 5C:
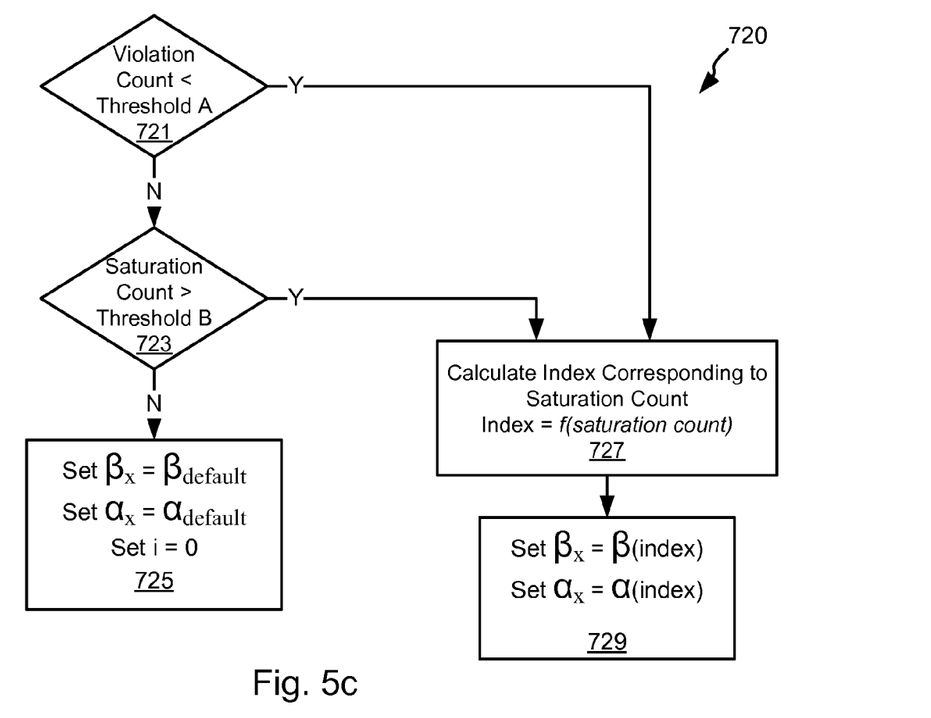

Turning to FIGS. 5a-5c, three different approaches for dynamically calculating scaling factors are shown in accordance with different embodiments of the present invention. Following flow diagram 700 of FIG. 5a, each time a decode process is completed, it is determined whether the violation count is less than a first threshold (i.e., Threshold A) (block 701) or whether the saturation count is greater than a second threshold (i.e., Threshold B) (block 703). Where either are true (blocks 701, 703), the scaling factors are updated (block 707). In particular, the scaling factors are updated in accordance with the following equations:

$$\beta \text{ Scaling Factor} = \beta_{maximum}; \text{ and}$$
$$\alpha \text{ Scaling Factor} = \alpha_{minimum}.$$

Otherwise, where an update is not called for (blocks 701, 703), scaling factors are set to default levels (block 705) in accordance with the following equations:

$$\beta \text{ Scaling Factor} = \beta_{default}; \text{ and}$$
$$\alpha \text{ Scaling Factor} = \alpha_{default}.$$

Following flow diagram 710 of FIG. 5b, each time a decode process is completed, it is determined whether the violation count is less than a first threshold (i.e., Threshold A) (block 711) or whether the saturation count is greater than a second threshold (i.e., Threshold B) (block 713). Where either are true (blocks 711, 713), an index (i) used to access scaling data from a lookup table is incremented (block 717). The scaling factors are then pulled from the lookup table using the index (block 729). In particular, the scaling factors are updated in accordance with the following equations:

$$\beta \text{ Scaling Factor} = \beta(i); \text{ and}$$
$$\alpha \text{ Scaling Factor} = \alpha(i).$$

$\beta(i+1)$ is greater than $\beta(i)$ and $\alpha(i+1)$ is less than $\alpha(i)$. Otherwise, where an update is not called for (blocks 711, 713), the scaling factors are set to default levels (block 715) in accordance with the following equations:

$$\beta \text{ Scaling Factor} = \beta_{default}; \text{ and}$$
$$\alpha \text{ Scaling Factor} = \alpha_{default}.$$

Following flow diagram 720 of FIG. 5c, each time a decode process is completed, it is determined whether the violation count is less than a first threshold (i.e., Threshold A) (block 721) or whether the saturation count is greater than a second threshold (i.e., Threshold B) (block 723). Where either are true (blocks 721, 723), an index corresponding to the saturation count is calculated (block 727). In some cases, the index is the saturation count multiplied by a scalar value and raised to the next whole number. The scaling factors are then pulled from the lookup table using the index (block 729). In particular, the scaling factors are updated in accordance with the following equations:

$$\beta \text{ Scaling Factor} = \beta(\text{index}); \text{ and}$$
$$\alpha \text{ Scaling Factor} = \alpha(\text{index}).$$

$\beta(i+1)$ is greater than $\beta(i)$ and $\alpha(i+1)$ is less than $\alpha(i)$. Otherwise, where an update is not called for (blocks 721, 723), the scaling factors are set to default levels (block 725) in accordance with the following equations:

$$\beta \text{ Scaling Factor} = \beta_{default}; \text{ and}$$
$$\alpha \text{ Scaling Factor} = \alpha_{default}.$$

Figure 5D:
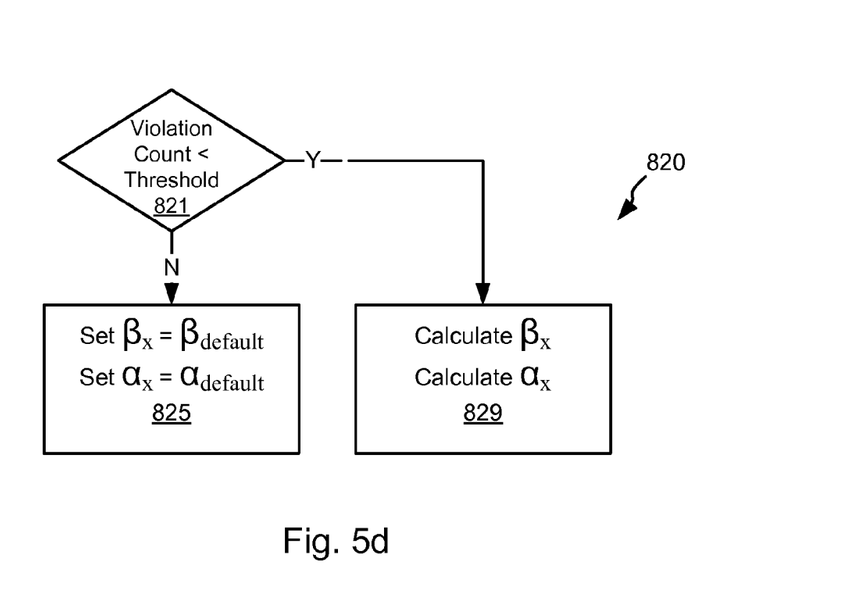

Following flow diagram 820 of FIG. 5d, each time a decode process is completed, it is determined whether the violation count is less than a threshold (block 821). Where this is true (blocks 821), scaling factors ($\beta_x$, $\alpha_x$) are calculated (block 829). Otherwise, where an update is not called for (block 821), the scaling factors are set to default levels (block 825) in accordance with the following equations:

$$\beta \text{ Scaling Factor} = \beta_{default}; \text{ and}$$
$$\alpha \text{ Scaling Factor} = \alpha_{default}.$$

Figure 6:
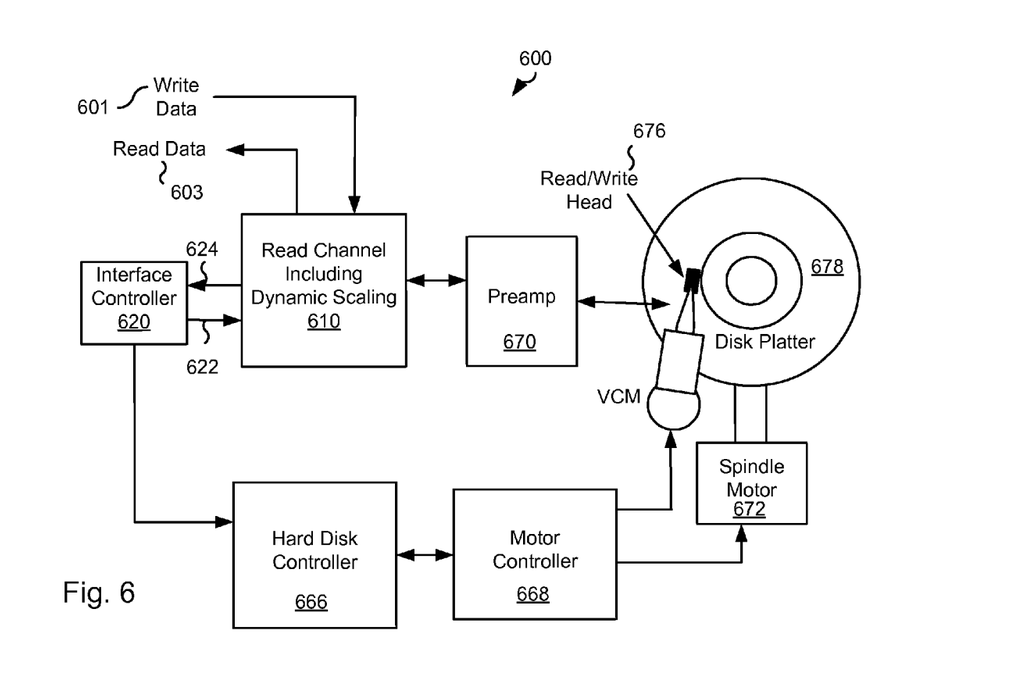
FIG. 6 shows a storage system with dynamic scaling in accordance with various embodiments of the present invention.

Turning to FIG. 6, a storage system 600 including read channel 610 with hard decision assisted decoding in accordance with various embodiments of the present invention. Storage system 600 may be, for example, a hard disk drive. Read channel 610 may include, but is not limited to, a data processing codec similar to those described above in relation to FIG. 2 or FIG. 3 that include dynamic scalar calculation. In some cases, the data processing codec may operate similar to that described in relation to FIG. 4.

Storage system 600 also includes a preamplifier 670, an interface controller 620, a hard disk controller 666, a motor controller 668, a spindle motor 672, a disk platter 678, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with a perpendicular recording scheme. For example, the magnetic signals may be recorded as either longitudinal or perpendicular recorded signals.

In a typical read operation, read/write head assembly 676 is accurately positioned by motor controller 668 over a desired data track on disk platter 678. The appropriate data track is defined by an address received via interface controller 620. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel 610 via preamplifier 670. Preamplifier 670 is operable to amplify the minute analog signals accessed from disk platter 678. In turn, read channel module 610 decodes and digitizes the received analog signal to recreate the information originally written to disk platter 678. The decoding process includes hard decision assist which, in some cases, may limit the amount of processing required for convergence and in other cases may allow convergence that otherwise would not be possible. The read data is provided as read data 603. A write operation is substantially the opposite of the preceding read operation with write data 601 being provided to read channel module 610. This data is then encoded and written to disk platter 678.

In conclusion, the invention provides novel systems, devices, methods and arrangements for performing data decoding and/or detection. While detailed descriptions of one or more embodiments of the invention have been given above, various alternatives, modifications, and equivalents will be apparent to those skilled in the art without varying from the spirit of the invention. For example, one or more embodiments of the present invention may be applied to various data storage systems and digital communication systems, such as, for example, tape recording systems, optical disk drives, wireless systems, and digital subscribe line systems. Therefore, the above description should not be taken as limiting the scope of the invention, which is defined by the appended claims.

What is claimed is:

1. A data processing system, the system comprising:
a decoder circuit, wherein the decoder circuit is operable to provide a decoded output;
a dynamic scalar calculation circuit, wherein the dynamic scalar calculation circuit is operable to determine a first dynamic scaling value and a second dynamic scaling value based at least in part on the decoded output;
a first multiplier circuit, wherein the first multiplier circuit operable to multiply the decoded output by the first dynamic scaling value and to provide a first scaled output;

a detector circuit, wherein the detector circuit is operable to receive the first scaled output and to provide a detected output; and a second multiplier circuit, wherein the second multiplier circuit is operable to multiply the detected output by the second dynamic scaling value and to provide a second scaled output.

2. The data processing system of claim 1, wherein the dynamic scalar calculation circuit is operable to determine a number of saturated outputs in the decoded output.

3. The data processing system of claim 2, wherein the first dynamic scaling value is set to a first default value when the number of saturated outputs exceeds a threshold value; wherein the first dynamic scaling value is set to a minimum value when the number of saturated outputs is less than the threshold value; wherein the second dynamic scaling value is set to a second default value when the number of saturated outputs exceeds the threshold value, and wherein the second dynamic scaling value is set to a maximum value when the number of saturated outputs is less than the threshold value.

4. The data processing system of claim 2, wherein having a number of saturated outputs exceeding a threshold value is an out of bounds condition; wherein an index corresponding to the number of successive out of bounds conditions is determined; wherein the first dynamic scaling value is set to a first scalar value corresponding to the index; and wherein the second dynamic scaling value is set to a second scalar value corresponding to the index.

5. The data processing system of claim 4, wherein the first scalar value and second scalar value are maintained in a lookup table, and wherein the index is a pointer into the lookup table.

6. The data processing system of claim 2, wherein an index corresponding to the number of saturated outputs is determined; wherein the first dynamic scaling value is set to a first scalar value corresponding to the index; and wherein the second dynamic scaling value is set to a second scalar value corresponding to the index.

7. The data processing system of claim 6, wherein the first scalar value and second scalar value are maintained in a lookup table, and wherein the index is a pointer into the lookup table.

8. The data processing system of claim 1, wherein the dynamic scalar calculation circuit determines a number of violated checks represented in the decoded output.

9. The data processing system of claim 8, wherein the first dynamic scaling value is set to a first default value when the number of violated checks is less than a first threshold value; wherein the first dynamic scaling value is set to a minimum value when the number of violated checks is greater than the first threshold value; wherein the second dynamic scaling value is set to a second default value when the number of violated checks is less than a second threshold value, and wherein the second dynamic scaling value is set to a maximum value when the number of violated checks is greater than the second threshold value.

10. The data processing system of claim 9, wherein having a number of violated checks less than a threshold value is an out of bounds condition; wherein an index corresponding to the number of successive out of bounds conditions is determined; wherein the first dynamic scaling value is set to a first scalar value corresponding to the index; and wherein the second dynamic scaling value is set to a second scalar value corresponding to the index.

11. The data processing system of claim 10, wherein the first scalar value and second scalar value are maintained in a lookup table, and wherein the index is a pointer into the lookup table.

12. The data processing system of claim 1, wherein the dynamic scalar calculation circuit is operable to determine a number of saturated outputs in the decoded output; and wherein the dynamic scalar calculation circuit is operable to determine a number of violated checks represented in the decoded output.

13. A method for data processing, the method comprising:
providing a decoder circuit, wherein the decoder circuit receives a first input and provides a decoded output;
providing a detector circuit, wherein the detector circuit receives a second input and provides a detected output;
dynamically determining a first scaling value and a second scaling value based at least in part on the decoded output;
multiplying the decoded output by the first scaling value to yield the second input; and
multiplying the detected output by the second scaling value to yield a product output.

14. The method of claim 13, wherein dynamically determining the first scaling value and the second scaling value includes determining a number of saturated outputs in the decoded output.

15. The method of claim 14, wherein the first dynamic scaling value is set to a first default value when the number of saturated outputs exceeds a threshold value; wherein the first dynamic scaling value is set to a minimum value when the number of saturated outputs is less than the threshold value; wherein the second dynamic scaling value is set to a second default value when the number of saturated outputs exceeds the threshold value, and wherein the second dynamic scaling value is set to a maximum value when the number of saturated outputs is less than the threshold value.

16. The method of claim 14, wherein having a number of saturated outputs exceeding a threshold value is an out of bounds condition; wherein an index corresponding to the number of successive out of bounds conditions is determined; wherein the first dynamic scaling value is set to a first scalar value corresponding to the index; and wherein the second dynamic scaling value is set to a second scalar value corresponding to the index.

17. The method of claim 13, wherein dynamically determining the first scaling value and the second scaling value includes determining a number of violated checks represented in the decoded output.

18. The method of claim 17, wherein the first dynamic scaling value is set to a first default value when the number of violated checks is less than a first threshold value; wherein the first dynamic scaling value is set to a minimum value when the number of violated checks is greater than the first threshold value; wherein the second dynamic scaling value is set to a second default value when the number of violated checks is less than a second threshold value, and wherein the second dynamic scaling value is set to a maximum value when the number of violated checks is greater than the second threshold value.

19. The method of claim 17, wherein having a number of violated checks less than a threshold value is an out of bounds condition; wherein an index corresponding to the number of successive out of bounds conditions is determined; wherein the first dynamic scaling value is set to a first scalar value corresponding to the index; and wherein the second dynamic scaling value is set to a second scalar value corresponding to the index.

20. A disk drive system, the disk drive system comprising:
a storage medium;
a read channel device operable to receive data derived from the storage medium, wherein the read channel device includes:
- a decoder circuit, wherein the decoder circuit is operable to provide a decoded output;
- a dynamic scalar calculation circuit, wherein the dynamic scalar calculation circuit is operable to determine a first dynamic scaling value and a second dynamic scaling value based at least in part on the decoded output;
- a first multiplier circuit, wherein the first multiplier circuit operable to multiply the decoded output by the first dynamic scaling value and to provide a first scaled output;
- a detector circuit, wherein the detector circuit is operable to receive the first scaled output and to provide a detected output; and
- a second multiplier circuit, wherein the second multiplier circuit is operable to multiply the detected output by the second dynamic scaling value and to provide a second scaled output.

\* \* \* \* \*